(12) United States Patent
Rhodes

(10) Patent No.: US 7,524,695 B2
(45) Date of Patent: Apr. 28, 2009

(54) IMAGE SENSOR AND PIXEL HAVING AN OPTIMIZED FLOATING DIFFUSION

(75) Inventor: Howard E. Rhodes, Boise, ID (US)

(73) Assignee: Omnivision Technologies, Inc., Santa Clara, CA (US)

( * ) Notice: Subject to any disclaimer, the term of this patent is extended or adjusted under 35 U.S.C. 154(b) by 88 days.

(21) Appl. No.: 11/509,945

(22) Filed: Aug. 25, 2006

(65) Prior Publication Data

US 2006/0286708 A1 Dec. 21, 2006

Related U.S. Application Data

(62) Division of application No. 11/036,917, filed on Jan. 14, 2005, now Pat. No. 7,115,925.

(51) Int. Cl.
*H01L 21/00* (2006.01)

(52) U.S. Cl. .............. 438/60; 438/48; 438/57; 438/59; 438/73; 438/75; 438/299; 438/301

(58) Field of Classification Search .......... 438/48, 438/57, 59, 60, 73, 75, 299, 301
See application file for complete search history.

(56) References Cited

U.S. PATENT DOCUMENTS

| 5,418,741 | A | | 5/1995 | Gill | |
|---|---|---|---|---|---|
| 6,046,466 | A | | 4/2000 | Ishida et al. | |
| 6,107,149 | A | * | 8/2000 | Wu et al. | 438/303 |
| 6,552,394 | B2 | * | 4/2003 | Ahmad et al. | 257/344 |
| 6,576,965 | B2 | * | 6/2003 | Eikyu et al. | 257/408 |
| 6,583,473 | B1 | | 6/2003 | Violette et al. | |
| 6,730,555 | B2 | | 5/2004 | Kim et al. | |
| 7,071,505 | B2 | * | 7/2006 | Rhodes | 257/292 |
| 7,105,906 | B1 | * | 9/2006 | Hopper et al. | 257/440 |
| 2002/0036300 | A1 | | 3/2002 | Pain et al. | |
| 2004/0129990 | A1 | * | 7/2004 | Lee | 257/428 |
| 2004/0183109 | A1 | | 9/2004 | Kuriyama | |
| 2004/0217394 | A1 | * | 11/2004 | Lee | 257/291 |
| 2004/0217398 | A1 | | 11/2004 | Lee | |
| 2004/0251482 | A1 | | 12/2004 | Rhodes | |
| 2005/0040393 | A1 | | 2/2005 | Hong | |
| 2006/0011952 | A1 | | 1/2006 | Ohkawa | |
| 2006/0043437 | A1 | | 3/2006 | Mouli | |
| 2006/0046338 | A1 | | 3/2006 | Patrick et al. | |

FOREIGN PATENT DOCUMENTS

EP 1 394 858 A2 3/2004

* cited by examiner

*Primary Examiner*—Kevin M Picardat
*Assistant Examiner*—Bac H Au
(74) *Attorney, Agent, or Firm*—Blakely Sokoloff Taylor & Zafman LLP

(57) ABSTRACT

An active pixel includes a a photosensitive element formed in a semiconductor substrate. A transfer transistor is formed between the photosensitive element and a floating diffusion and selectively operative to transfer a signal from the photosensitive element to the floating diffusion. The floating diffusion is formed from an n-type implant with a dosage in the range of 5e13 to 5e14 ions/cm$^2$. Finally, an amplification transistor is controlled by the floating diffusion.

4 Claims, 4 Drawing Sheets

IMAGE SENSOR AND PIXEL HAVING AN OPTIMIZED FLOATING DIFFUSION

CROSS REFERENCE TO RELATED APPLICATION(S)

This application is a divisional of U.S. patent application Ser. No. 11/036,917 filed Jan. 14, 2005 now U.S. Pat. No. 7,115,925 to which the benefit of priority is claimed.

TECHNICAL FIELD

The present invention relates to image sensors, and more particularly, to an image sensor that uses pixels having a lightly doped optimized floating diffusion.

BACKGROUND

Image sensors have become ubiquitous. They are widely used in digital still cameras, cellular phones, security cameras, medical, automobile, and other applications. The technology used to manufacture image sensors, and in particular CMOS image sensors, has continued to advance at great pace. For example, the demands of higher resolution and lower power consumption have encouraged the further miniaturization and integration of the image sensor.

A typical image sensor includes a pixel array of rows and columns comprised of individual pixels. Each pixel includes a photosensitive region and a readout region. For one commonly used type of pixel (the four transistor pixel), a transfer transistor transfers the signal output by the photosensitive region to a floating diffusion. The signal is then held by the floating diffusion until it can be read out by the readout portion of the pixel.

The floating diffusion region of a pixel is an important structure. Currently, the floating diffusion region is formed as an N+ implant in a semiconductor substrate. This enables the use of standard transistors which are adjacent to this floating diffusion (such as the transfer transistor and reset transistor). The use of the N+ implant to form the floating diffusion also provides a good ohmic contact between a contact plug and the floating diffusion.

However, there have been found to be several performance issues with this type of floating diffusion. First, the N+ implant creates an amorphous region that rearranges to reform the silicon crystalline lattice during subsequent thermal steps by a process known as solid phase epitaxial (SPE) regrowth. This regrowth begins simultaneously at several different physical locations on the floating diffusion. Where the regrowth fronts meet, a stacking fault can occur. The presence of a stacking fault in the floating diffusion will result in a much higher floating diffusion junction leakage with a consequent reduction in imager performance and lower yield.

Secondly, the high N+ implant dosage gives rise to high electric fields in the floating diffusion region, which results in increased floating diffusion junction leakage. Thirdly, the N+ implant with its high concentration diffuses laterally under the adjacent gates (the transfer gate and reset gate) and degrades their off state current performance and their short L punch-through performance. This limits the device scaling of these transistors.

DETAILED DESCRIPTION

In the following description, numerous specific details are provided in order to give a thorough understanding of embodiments of the invention. One skilled in the relevant art will recognize, however, that the invention may be practiced without one or more of the specific details, or with other methods, components, materials, etc. In other instances, well known structures, materials, or operations are not shown or described in order to avoid obscuring aspects of the invention.

Referenced throughout the specification to "one embodiment" or "an embodiment" means that a particular feature, structure, or characteristic described in connection with the embodiment and included in at least one embodiment of the present invention. Thus, the appearances of the phrase "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
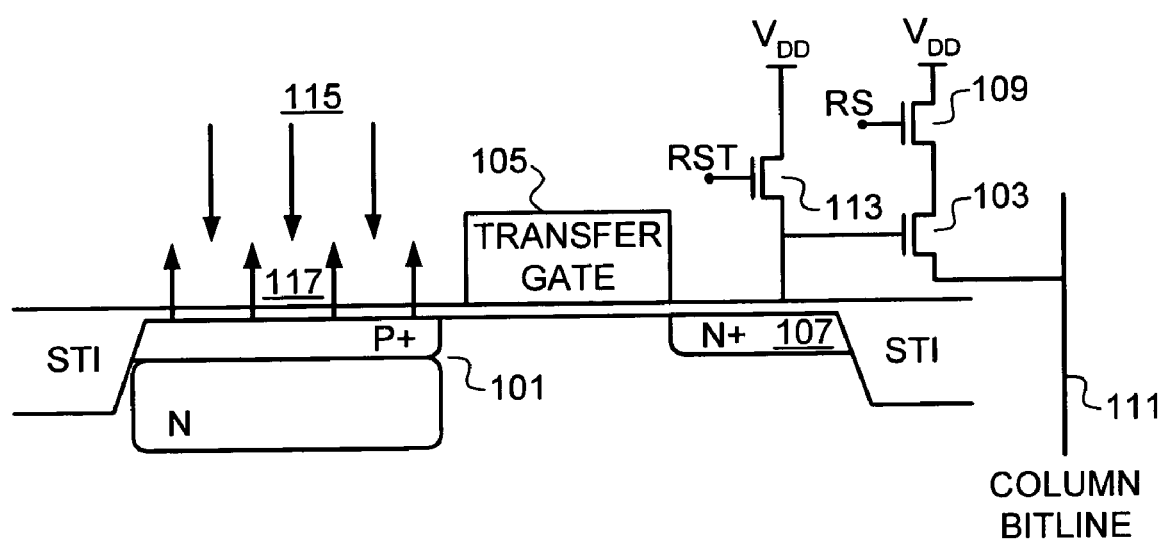
FIG. 1 is a combination cross-sectional and schematic diagram of a prior art four transistor (4T) pixel which shows in detail a photodiode formed in a substrate.

FIG. 1 shows a combination cross-sectional and schematic view of an active pixel that uses four transistors. This is known in the art as a 4T active pixel. A light-sensing element, in this embodiment a photodiode 101, outputs a signal that is used to modulate an amplification transistor 103. The amplification transistor 103 is also referred to as a source follower transistor. While the light-sensing element can be one of a variety of devices, including without limitation, photogates, photodiodes, pinned photodiodes, partially pinned photodiodes, etc., in the present invention, the light-sensing element is a photodiode (whether of the pinned or partially pinned variety). A transfer transistor 105 is used to transfer the signal output by the photodiode 101 to a floating node 107 (also referred to as a floating diffusion), which is connected to the gate of the amplification transistor 103. The transfer transistor 105 is controlled by a transfer gate.

A characteristic feature of a 4T active pixel is the presence of a transfer gate to enable true correlated double sampling (CDS). It is to be understood that this invention applies to all CMOS imagers whether they be formed with 4, 5, 6, 7, or more transistors. This invention also applies to CCD image sensors.

In operation, during an integration period (also referred to as an exposure or accumulation period), the photodiode 101 stores charge that is held in the N-type layer. After the integration period, the transfer transistor 105 is turned on to transfer the charge held in the N-type layer of the photodiode 101 to the floating node 107. After the signal has been transferred to the floating node 107, the transfer transistor 105 is turned off again for the start of a subsequent integration period.

The signal on the floating node 107 is then used to modulate the amplification transistor 103. Finally, an address transistor 109 is used as a means to address the pixel and to selectively read out the signal onto a column bit line 111. After readout through the column bit line 111, a reset transistor 113 resets the floating node 107 to a reference voltage through a reset node. In one embodiment, the reference voltage is $V_{dd}$.

Figure 2:
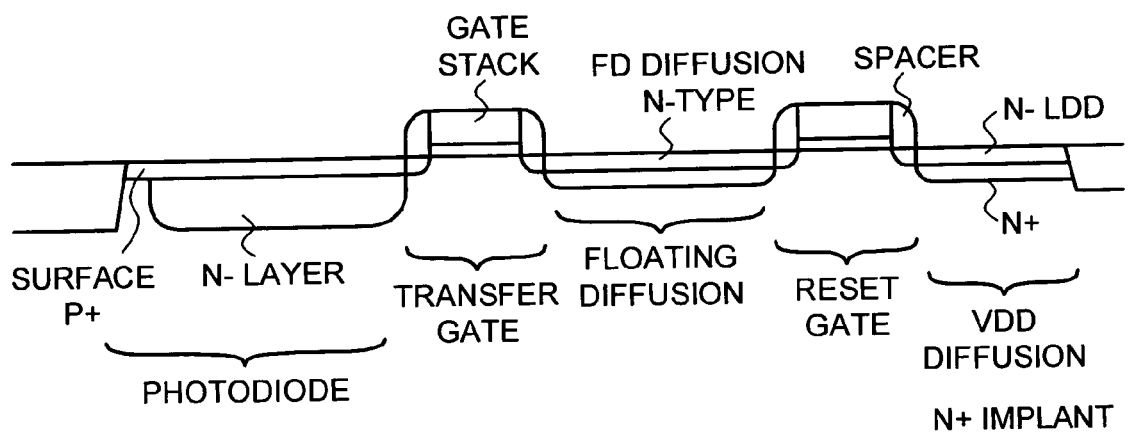
FIG. 2 is a cross-sectional diagram of a prior art 4T pixel.

Specifically, FIG. 2 shows in greater detail a cross-section view of a typical 4T pixel. As seen in FIG. 2, the reset transistor 113 and reset gate are adjacent the floating diffusion.

Note that the connection for the $V_{dd}$ voltage rail for the reset transistor 113 is an $N^+$ implant. Note further, that in the prior art, the floating diffusion is typically also an $N^+$ implant. Finally, lightly doped drain (LDD) regions are formed underneath sidewall spacers for the various gates.

Figure 3:
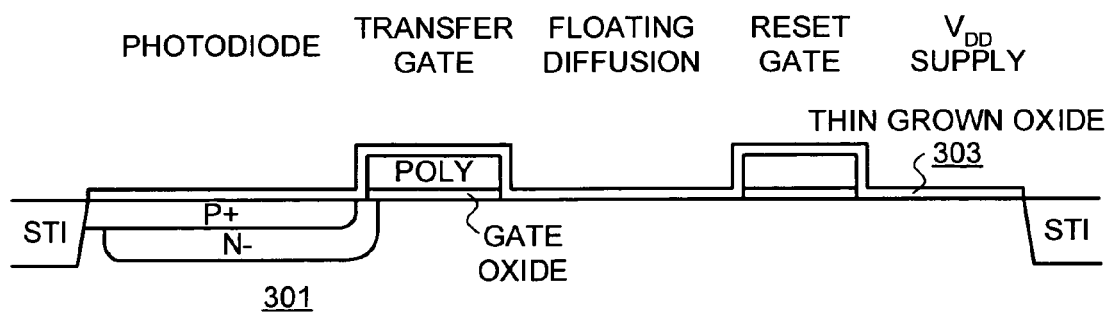
FIGS. 3-6 are cross sectional views illustrating the process of manufacturing a pixel with an optimized floating diffusion in accordance with the present invention.

FIGS. 3-7 show a method for forming a pixel with an optimized diffusion. As seen in FIG. 3, a portion of a 4T pixel is shown with a photodiode 301 formed in a p-type substrate or region. The pixel is bordered by field oxides, in this example, shallow trench isolations (STI). Further, the photodiode 301 shown in FIGS. 3-7 is a pinned photodiode. However, it can be appreciated that the present invention can be applied to any type of light-sensing element. Still referring to FIG. 3, a thin oxide layer 303 is grown or deposited over the gates structures and the surface of the substrate.

Figure 4:
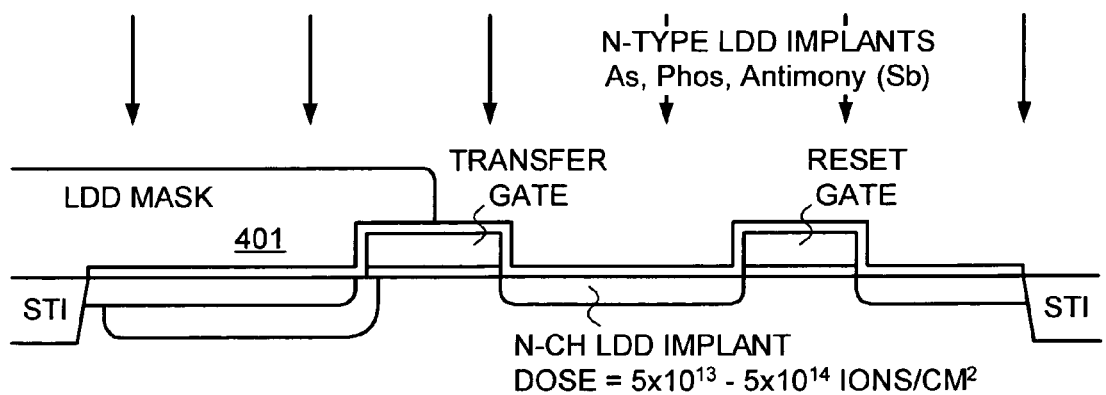

Next, turning to FIG. 4, a photoresist mask 401 is patterned for use in a lightly doped drain implant. The photoresist mask 401 allows an n-type implant (such as arsenic, phosphorus, or antimony) to be performed to form lightly doped regions between the transfer gate and reset gate, as well as between the reset gate and the STI region. In one embodiment, the lightly doped drain implant has a dosage of about 5e13 to 5e14 ions/cm².

Figure 5:
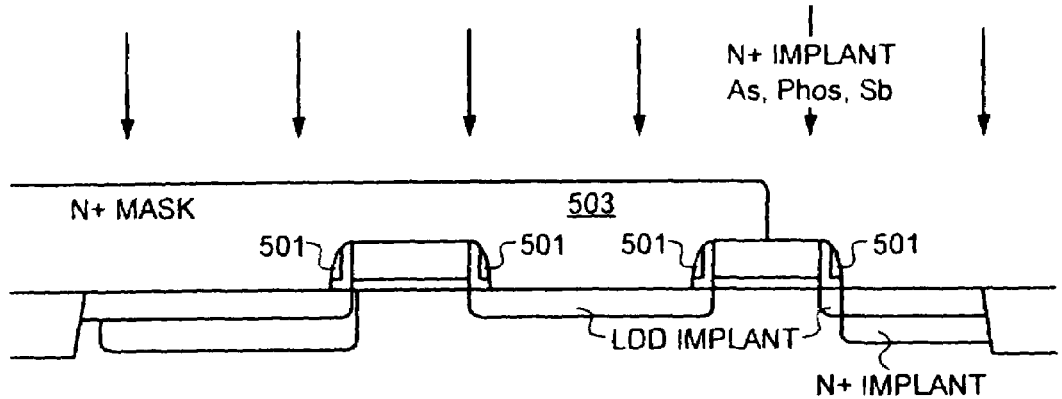

Next, turning to FIG. 5, various conventional steps are performed to form sidewall spacers 501 on the sidewalls of the transfer and reset gates. These structures, and the steps used to form them, are conventional in the prior art, but are briefly described herein for completeness. Still, there may be additional steps, such as enhancement implants, cleaning steps, P-well implants, etc. . . . that are well known in the art that have been omitted to avoid obscuring the present invention.

Still referring to FIG. 5, an $N^+$ photoresist mask 503 is patterned onto the wafer. The $N^+$ photoresist mask 503 exposes the region between the reset gate and the STI, but covers the floating diffusion region between the transfer gate and the reset gate. Thus, an $N^+$ implant can be performed without affecting the floating diffusion region. An $N^+$ region is formed only between the reset gate and STI to serve as the connection to $V_{dd}$. The $N^+$ implant may be performed using, for example, an arsenic, phosphorus, or antimony dopant.

Figure 6:
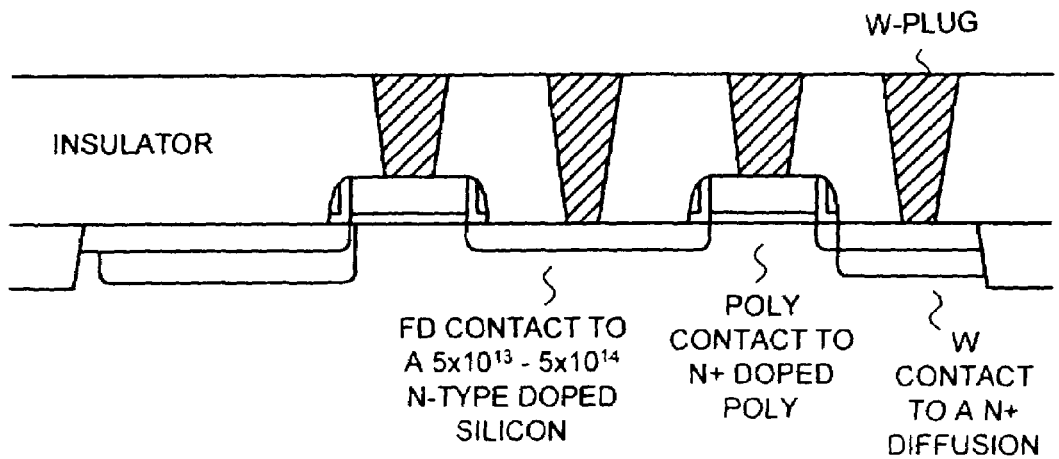

Next, turning to FIG. 6, the $N^+$ photoresist mask 503 is removed and conventional steps are performed to form an insulator layer, contact holes, and contact plugs (such as tungsten) to connect the various devices of the pixels. Again, these structures, and the steps used to form them, are conventional in the prior art, but are only briefly described herein for completeness.

Note that the floating diffusion of the present invention is doped significantly lower than the prior art. The prior art used a floating diffusion that was doped in the $N^+$ range (1e15 to 5e16 ions/cm²). Under the teachings of the present invention, the floating diffusion is lightly doped, in the range of 5e13 to 5e14 ions/cm². At this dosage, an adequate Schottky contact to the floating diffusion can still be formed. However, at this dose, an amorphous region is not formed and the junction will not have the leakage issues associated with an $N^+$ implant.

Further, in order to better grade the junction, and to reduce the electric field, in accordance with one embodiment of the present invention, in an optimized floating diffusion implant process, a combination arsenic and phosphorus implant would be used for the lightly doped drain implant. The arsenic implant provides a high surface concentration (relatively) to support a solid Schottky contact and to reduce the lateral diffusion under the adjacent gates. The phosphorus dose, which may be applied at the same time in the process, would further grade the doping profile and provide a reduced electric field and a reduced junction leakage. The deeper phosphorus implant also provides protection against contact over etching. Further, the use of the moderate dosed lightly doped drained floating diffusion during the middle of the process flow can be fully activated by subsequent high temperature steps such as rapid thermal processing anneals.

As another benefit, by having a lower doping concentration for the floating diffusion, the floating diffusion capacitance is lower. This enables the pixel to have a higher conversion gain, which translates to improved low light sensitivity.

From the foregoing, it will be appreciated that specific embodiments of the invention have been described herein for purposes of illustration, but that various modifications may be made without deviating from the spirit and scope of the invention.

For example, it may be possible to use the concepts of the present invention with NPN pinned photodiodes, where the dopant types are switched from that shown in the Figures. Specifically, the pixel may use p-channel transistors and the photodiode may be formed from a shallow $P^-$ region formed in an n-type substrate (or N-well). The floating diffusion would then be lightly doped with a p-type dopant, such as boron or indium. In the case of a graded floating diffusion, both indium and boron would be used with indium providing a higher surface concentration and boron providing a lower dosage, but greater depth into the substrate. Thus, the methods and teachings of the present invention may be applied to devices of reverse polarity from that described above and shown in the drawings.

Accordingly, the invention is not limited except as by the appended claims.

I claim:

1. A method of manufacturing a pixel having a floating diffusion, the method comprising:

forming a photosensitive element in a semiconductor substrate;

forming a transfer gate between said floating diffusion and said photosensitive element;

forming a reset gate adjacent to said floating diffusion and between said floating diffusion and a reset node, wherein said reset node is formed by using an $N^+$ implant while shielding said floating diffusion from said $N^+$ implant; and using a lightly doped drain implant process to form said floating diffusion between said transfer gate and said reset gate, wherein said lightly doped drain implant process comprises a dual n-type implant that grades the floating diffusion, wherein said floating diffusion is a single floating diffusion having a dual n-type implant dosage in the range from about 5e13 to 5e14 ions/cm² that extends from the transfer gate to the reset gate.

2. The method of claim 1 wherein said dual n-type implant comprises an implant of arsenic and phosphorous.

3. A method of manufacturing a pixel having a floating diffusion, the method comprising:

forming a photosensitive element in a semiconductor substrate;

forming a transfer gate between said floating diffusion and said photosensitive element;

forming a reset gate adjacent to said floating diffusion and between said floating diffusion and a reset node, wherein said reset node is formed by using a $P^+$ implant while shielding said floating diffusion from said $P^+$ implant; and using a lightly doped drain implant process to form said floating diffusion between said transfer gate and said reset gate, wherein said lightly doped drain implant process comprises a dual p-type implant that grades the floating diffusion, wherein said floating diffusion is a single floating diffusion having a dual p-type implant dosage in the range from about 5e13 to 5e14 ions/cm$^2$ that extends from the transfer gate to the reset gate.

4. The method of claim 3 wherein the dual p-type implant comprises an implant of indium and boron.

* * * * *